United States Patent
Galtie et al.

(10) Patent No.: US 6,583,496 B2
(45) Date of Patent: Jun. 24, 2003

(54) SINGLE-CONTROL MONOLITHIC COMPONENT FOR A COMPOSITE BRIDGE

(75) Inventors: Franck Galtie, Veretz (FR); Olivier Ladiray, Montlouis sur Loire (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/847,653

(22) Filed: May 2, 2001

(65) Prior Publication Data

US 2002/0008247 A1 Jan. 24, 2002

(30) Foreign Application Priority Data

May 5, 2000 (FR) .............................................. 00 05804

(51) Int. Cl.$^7$ ......................... H01L 29/93; H01L 29/74; H01L 29/417
(52) U.S. Cl. ....................... 257/601; 257/173; 257/107; 257/119; 257/121
(58) Field of Search ................................ 257/107, 119, 257/121, 173, 601

(56) References Cited

U.S. PATENT DOCUMENTS

| | | | | |
|---|---|---|---|---|
| 4,449,176 A | * | 5/1984 | Turnbull | 363/81 |
| 5,998,813 A | * | 12/1999 | Bernier | 257/175 |
| 6,017,778 A | | 1/2000 | Pezzani | |
| 6,049,096 A | * | 4/2000 | Bernier | 257/173 |
| 6,075,277 A | | 6/2000 | Pezzani | |
| 6,188,267 B1 | * | 2/2001 | Sanchez et al. | 327/438 |

FOREIGN PATENT DOCUMENTS

EP  0 881 672 A1  12/1998

OTHER PUBLICATIONS

Sanchez J.L. et al. "Trends In Design And Technology For New Power Integrated Devices Based on Functional Integration" EPE. European Conference on Power Electronics and Applications, B, Brussels, EPE Association, vol. Conf. 7, Sep. 8, 1997, pp. 1302–1307.
French Search Report from French Patent Application No. 00/05804, filed May 5, 2000.

* cited by examiner

Primary Examiner—Nathan J. Flynn
Assistant Examiner—Johannes P Mondt
(74) Attorney, Agent, or Firm—Wolf, Greenfield & Sacks, P.C.; James H. Morris; Gary S. Engelson

(57) ABSTRACT

A monolithic component including two thyristors of a composite bridge connected to an A.C. voltage terminal by a common terminal corresponding to a common rear surface metallization forming an electrode of opposite biasing of each thyristor. An isolating wall separates a substrate in two portions, a first portion includes on its lower surface side an anode region and on its upper surface side a cathode region, the second portion includes on its lower surface side a cathode region and on its upper surface side an anode region. The isolating wall surrounding each of the components extending towards the main electrode on the side which carries no common metallization and including in this extended region an N-type area, the two areas being connected together to a common control terminal.

4 Claims, 1 Drawing Sheet

SINGLE-CONTROL MONOLITHIC COMPONENT FOR A COMPOSITE BRIDGE

BACKGROUND OF THE INVENTION

1. Field of the Invention

The present invention relates to the forming of a controlled rectifying bridge, or composite bridge.

2. Discussion of the Related Art

FIG. 1 shows the conventional diagram of a composite bridge intended for continuously supplying a load 1. This bridge is connected by terminals 2 and 3 to the A.C. power system, terminal 3 being considered as the reference terminal. The anode of a diode D1 and the cathode of a diode D2 are connected to terminal 2. The cathode of diode D1 and the anode of diode D2 are connected across load 1. A thyristor Th1 is connected by its anode to terminal 3 and by its cathode to the cathode of diode D1. A thyristor Th2 is connected by its cathode to terminal 3 and by its anode to the anode of diode D2. With such a bridge, a rectified current can be made to flow through load 1. Further, triggerings on halfwave portions can be implemented, which is currently called a phase-angle control.

The bridge of FIG. 1 has many advantages as compared to the various other known controlled bridge assemblies. As compared to a bridge including two thyristors in series, it has the advantage that diodes D1 and D2 are used as free wheel diodes during the phases when thyristors Th1 and Th2 are off. As compared to a bridge with 4 diodes in series with a triac, it especially has the advantage that, when on, the voltage drop is reduced substantially by the voltage drop of a forward diode.

Despite these advantages, the assembly of FIG. 1 is seldom used, because of a thyristor control problem. Indeed, thyristors Th1 and Th2 are controlled by gate voltages respectively referenced to their cathodes. Now, the cathodes of thyristors Th1 and Th2 are not at the same potential. This requires the use of relatively complex distinct control circuits, and frequently isolated control circuits, the isolation being ensured, for example, by a transformer or by optically controlled components. Further, in known circuits, both thyristors Th1 and Th2 are generally made in the form of discrete components.

U.S. Pat. No. 5,365,086, which is incorporated herein by reference, describes a thyristor, the cathode of which corresponds to the rear surface of the component coated with a single metallization connected to a reference terminal, and the control terminal of which is taken on the opposite side and is referenced to the cathode. It could be imagined to use this thyristor to replace thyristor Th2 of FIG. 1. However, this patent does not suggest how to associate a thyristor to a thyristor of opposite biasing.

U.S. Pat. No. 6,034,381, which is incorporated herein by reference, describes a bidirectional switch (ACS), the control electrode of which is arranged on the surface opposite to a common surface, the control voltage being referenced to this common terminal. However, this patent only describes a bidirectional switch with a single control terminal and two main electrodes only, and does not indicate how to form two thyristors having a common main terminal and the other terminals of which are distinct.

SUMMARY OF THE INVENTION

Thus, an object of the present invention is to provide a monolithic component corresponding to two thyristors connected by one of their main terminals of opposite biasing forming a surface of the component, a single control terminal enabling operation of the two thyristors being arranged on the opposite component surface at the same time as the other main terminal of each of the thyristors.

To achieve this and other objects, the present invention provides a monolithic component including two thyristors of a composite bridge connected to an A.C. voltage terminal by a common terminal corresponding to a common rear surface metallization forming an electrode of opposite biasing of each thyristor, including, in a substrate of a first conductivity type, an isolating wall separating the substrate in two portions, a first portion including on its lower surface side an anode region and on its upper surface side a cathode region, the second portion including on its lower surface side a cathode region and on its upper surface side an anode region, the isolating wall surrounding each of the components extending towards the main electrode on the side which carries no common metallization and including in this extended region an area of the second conductivity type, the two areas being connected together to a common control terminal.

According to an embodiment of the present invention, on the upper surface side, the cathode gate region in which the cathode region of a first thyristor is included, as well as the anode region of the other thyristor, is surrounded by a ring of a first conductivity type of high doping level formed in the substrate.

The foregoing objects, features and advantages of the present invention, will be discussed in detail in the following non-limiting description of specific embodiments in connection with the accompanying drawings.

DETAILED DESCRIPTION

Figure 1:
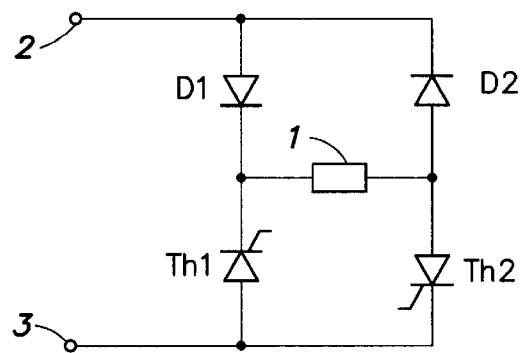
FIG. 1 shows the circuit diagram of a composite bridge.
Figure 2:
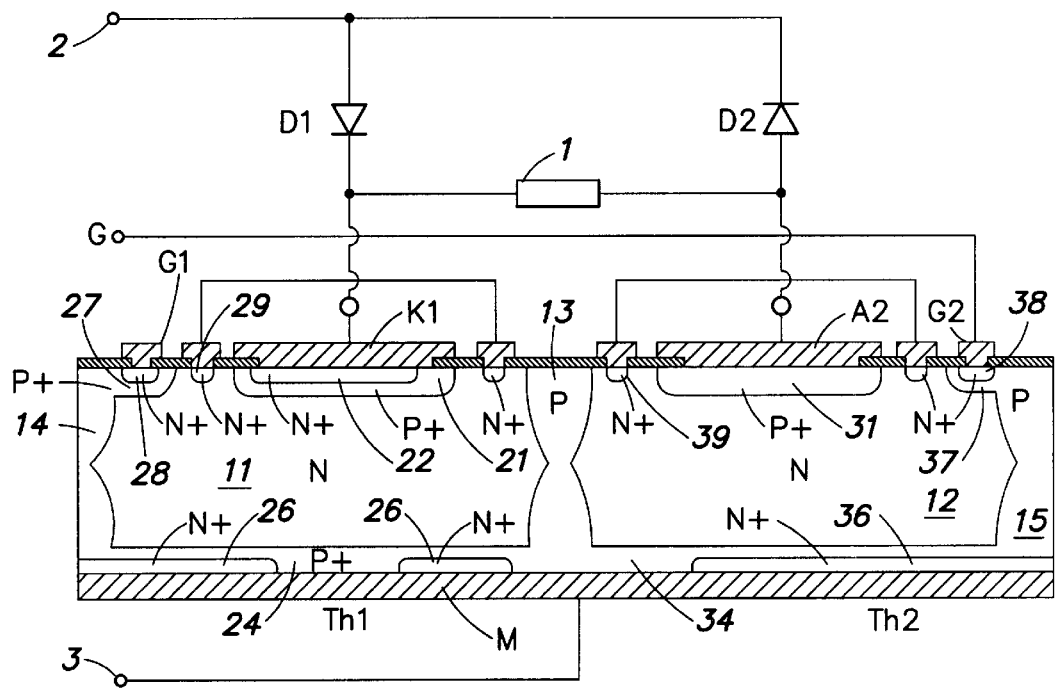
FIG. 2 shows an embodiment of the two thyristors of the composite bridge in a monolithic embodiment according to the present invention.

FIG. 2 shows, in the form of a circuit diagram, load 1 and diodes D1 and D2 of FIG. 1. Thyristors Th1 and Th2 are shown in the form of a cross-section view of a monolithic component. This component is formed from an N-type substrate divided in two portions 11 and 12 by a P-type isolating wall 13. In the embodiment shown, separation wall 13 is part of respective isolating walls 14 and 15 delimiting each of the substrate portions in which are respectively formed thyristor Th1 and thyristor Th2. On the rear surface side is deposited a common metallization M, which forms the anode metallization of thyristor Th1 and the cathode metallization of thyristor Th2.

Thyristor Th1 includes, on the front surface side, a P-type region 21 in which is formed an N-type region 22. Region 22 corresponds to the cathode of thyristor Th1 and is coated with a cathode metallization K1 connected to the cathode terminal of diode D1. On the rear surface side, a P+-type layer 24 is formed and, in the portions of this P+ layer which are not arranged in front of cathode 22, N-type regions 26 useful to the thyristor starting are formed. On the side of the upper portion of isolating wall 14 is formed a region 27, also of type P+, extending towards cathode 22. In this region 27 is formed an N-type region 28 coated with a metallization G1 corresponding to the gate of thyristor Th1.

The starting of thyristor Th1 can occur when its anode, that is, rear surface metallization M, is positive with respect to front surface metallization K1 and when a negative voltage with respect to the rear surface is applied on gate terminal G. Then, the junction between regions 28 and 27 is forward biased and electrons coming from region 28 are injected into region 27. As a result, holes are injected by region P24 towards regions 21 and 22, which turns on thyristor Th1.

Thyristor Th2 includes on its front surface side a P+-type region 31, preferably formed at the same time as region 21, which forms its anode on which is formed an anode metallization A2 connected to the anode of diode D2. On the rear surface side, a P+-type region 34 formed at the same time as layer 24 and a cathode layer 36 formed at the same time as region 26 of thyristor Th1 are found. On the front surface side, isolating wall 15 extends towards the anode in a P-type region 37 in which is formed an N-type region 38 covered with a gate metallization G2 connected to gate metallization G1 of thyristor Th1 and to a control terminal G. When thyristor Th2 is properly biased, if a gate pulse is applied, the junction between layer 34 and substrate 12 unlocks and thyristor Th2 turns on.

It should be noted that thyristors Th1 and Th2 are arranged in distinct wells. This avoids, when one of the thyristors is switched off by a biasing inversion, for the other thyristor to be restarted by charges stored in regions neighboring the other thyristor. The starting of a lateral parasitic thyristor, which would correspond to regions P13, N12-11, P21, and N22 is thus also avoided.

Further, to avoid creating leakage currents and untimely startings of the thyristors, each of regions 21 and 31 is surrounded with a heavily-doped N-type channel stop region, respectively 29 and 39.

As compared to the various known components, to form the controlled elements of a composite bridge, this circuit has at least some of the following advantages:

implementation in the form of a monolithic component;

control by a single circuit, which may be a microprocessor, the control circuit being referenced to the ground;

isolation between the two thyristors Th1 and Th2, whereby parasitic startings are avoided;

good sensitivity.

Of course, the present invention is likely to have various alterations, modifications, and improvements which will readily occur to those skilled in the art who will know how to size the various layers according to the provided currents. Further, it should be noted that diodes D1 and D2 may be integrated in the same component as the two previously-described controlled thyristors, these diodes being formed in isolated wells.

The present invention will, for example, apply in the electro-domestic field to the control of electromagnets or to the control of universal motors. In both cases, the use of a composite bridge of the previously-described type is advantageous due to the fact that diodes D1 and D2 can operate in free wheel on an inductive load when one or the other of the thyristors is off.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A monolithic component including a first thyristor and a second thyristor, the component comprising:

a common contact on one surface of the component conductively connected to the anode of the first thyristor and the cathode of the second thyristor;

an isolation wall separating the first and the second thyristor, the isolation wall of a same conductivity type and contiguous with the anode of the first thyristor as well as a layer of the second thyristor immediately adjacent to the cathode of the second thyristor;

at least one gate contact on a surface opposite to the common contact which controls both the first and second thyristor;

at least one region disposed beneath and conductively coupled to the at least one gate contact, forming at least one diode junction with the isolating wall.

2. The device of claim 1, wherein the isolating wall forming a diode junction with a region conductively connected to the gate contact is used for starting the properly first and second thyristors.

3. The device of claim 2, wherein the isolating wall is used to start the first thyristor by injecting carriers into the junction formed by the anode of the first thyristor and the layer of the first thyristor immediately adjacent to its anode.

4. The device of claim 3, wherein the isolating wall is used to start the second thyristor by injecting carriers into the junction formed by the cathode of the second thyristor and the layer of the second thyristor immediately adjacent to its cathode, which is formed of the isolating wall.

* * * * *